(12) United States Patent
Kusunoki et al.

(10) Patent No.: US 9,222,198 B2
(45) Date of Patent: Dec. 29, 2015

(54) SiC SINGLE CRYSTAL WAFER AND PROCESS FOR PRODUCTION THEREOF

(75) Inventors: Kazuhiko Kusunoki, Nishinomiya (JP); Kazuhito Kamei, Hyogo (JP); Nobuyoshi Yashiro, Itami (JP); Junichi Koike, Sendai (JP)

(73) Assignee: NIPPON STEEL & SUMITOMO METAL CORPORATION, Tokyo (JP)

( * ) Notice: Subject to any disclaimer, the term of this patent is extended or adjusted under 35 U.S.C. 154(b) by 0 days.

(21) Appl. No.: 13/385,566

(22) Filed: Feb. 27, 2012

(65) Prior Publication Data
US 2012/0211769 A1 Aug. 23, 2012

Related U.S. Application Data

(63) Continuation of application No. PCT/JP2010/064549, filed on Aug. 27, 2010.

(30) Foreign Application Priority Data

Aug. 27, 2009 (JP) ................................ 2009-196845

(51) Int. Cl.
*C30B 19/02* (2006.01)
*H01L 21/02* (2006.01)
(Continued)

(52) U.S. Cl.
CPC ................. *C30B 29/36* (2013.01); *C30B 19/02* (2013.01); *C30B 19/04* (2013.01); *C30B 19/062* (2013.01); *Y10T 428/21* (2015.01); *Y10T 428/265* (2015.01)

(58) Field of Classification Search
CPC ...... C30B 19/02; C30B 19/04; C30B 19/062; C30B 29/36; C30B 25/186; C30B 33/00; H01L 21/304; H01L 21/0445; H01L 21/02024; H01L 29/1608; H01L 21/306; H01L 21/02447; H01L 21/02529; B24D 37/042
USPC .............. 438/471, 931, 478; 257/77, 78, 646, 257/E21.009, E29.082, E21.054, E21.065, 257/E21.09; 117/11–87; 428/336, 446, 428/64.1; 977/755
See application file for complete search history.

(56) References Cited

U.S. PATENT DOCUMENTS 5,499,598 A * 3/1996 Oda ................................. 117/49
7,183,576 B2 * 2/2007 Chu et al. ......................... 257/77
(Continued)

FOREIGN PATENT DOCUMENTS

CN 1592949 3/2005
EP 1306890 A2 * 5/2003
(Continued)

OTHER PUBLICATIONS

M. IqbalChaudhry. "A study of native oxides of β—SiC using Auger electron spectroscopy", Journal of Materials Research—1989.*
(Continued)

*Primary Examiner* — Jarrett Stark
*Assistant Examiner* — Bitew Dinke
(74) *Attorney, Agent, or Firm* — Clark & Brody (57) ABSTRACT

A SiC single crystal wafer on which a good quality epitaxial film by suppressing defects derived from the wafer can be grown has an affected surface layer with a thickness of at most 50 nm and a SiC single crystal portion with an oxygen content of at most $1.0 \times 10^{17}$ atoms/cm$^3$. This SiC single crystal wafer is manufactured from a high purity SiC bulk single crystal obtained by the solution growth method using raw materials with an oxygen content of at most 100 ppm and a non-oxidizing atmosphere having an oxygen concentration of at most 100 ppm.

11 Claims, 2 Drawing Sheets

(51) Int. Cl.
*H01L 21/16* (2006.01)
*C30B 29/36* (2006.01)
*C30B 19/04* (2006.01)
*C30B 19/06* (2006.01)

(56) References Cited

U.S. PATENT DOCUMENTS

| | | | |
|---|---|---|---|
| 7,517,516 B2 * | 4/2009 | Fujita et al. | 423/448 |
| 7,625,447 B2 * | 12/2009 | Suda et al. | 117/94 |
| 7,635,413 B2 * | 12/2009 | Kusunoki et al. | 117/13 |
| 7,637,998 B2 * | 12/2009 | Kaneko et al. | 117/54 |
| 7,641,736 B2 * | 1/2010 | Hirooka | 117/97 |
| 7,955,582 B2 * | 6/2011 | Seidl et al. | 423/348 |
| 8,178,001 B2 * | 5/2012 | Kaneda et al. | 252/301.4 F |
| 8,388,752 B2 * | 3/2013 | Kamei et al. | 117/73 |
| 2001/0015170 A1 * | 8/2001 | Kitabatake | 117/95 |
| 2002/0096104 A1 * | 7/2002 | Yagi et al. | 117/84 |
| 2002/0182423 A1 * | 12/2002 | Chu et al. | 428/446 |
| 2004/0134418 A1 * | 7/2004 | Hirooka | 117/101 |
| 2006/0292057 A1 * | 12/2006 | Nakamura | 423/446 |
| 2007/0051301 A1 * | 3/2007 | Hirooka | 117/89 |
| 2007/0176210 A1 * | 8/2007 | Murphy et al. | 257/211 |
| 2007/0209573 A1 * | 9/2007 | Kusunoki et al. | 117/28 |
| 2008/0152568 A1 * | 6/2008 | Seidl et al. | 423/325 |
| 2008/0230780 A1 * | 9/2008 | Urashima | 257/51 |
| 2009/0026459 A1 * | 1/2009 | Chu et al. | 257/65 |
| 2009/0038538 A1 * | 2/2009 | Kaneko et al. | 117/54 |
| 2009/0085044 A1 * | 4/2009 | Ohno et al. | 257/77 |
| 2010/0104495 A1 * | 4/2010 | Kawabata et al. | 423/409 |
| 2010/0107969 A1 * | 5/2010 | Kuraoka et al. | 117/68 |
| 2010/0221917 A1 * | 9/2010 | Masuda | 438/692 |
| 2010/0288187 A1 * | 11/2010 | Terashima et al. | 117/73 |
| 2010/0288188 A1 * | 11/2010 | Terashima et al. | 117/73 |
| 2011/0084363 A1 * | 4/2011 | Ishibashi et al. | 257/609 |
| 2011/0156058 A1 * | 6/2011 | Hori et al. | 257/77 |
| 2012/0211769 A1 * | 8/2012 | Kusunoki et al. | 257/77 |
| 2012/0280254 A1 * | 11/2012 | Muto et al. | 257/77 |

FOREIGN PATENT DOCUMENTS

| | | | |
|---|---|---|---|
| EP | 1 981 076 A1 * | 10/2008 | |
| EP | 2 330 236 | 6/2011 | |
| JP | 01-298100 | 12/1989 | |
| JP | 06-188163 | 7/1994 | |
| JP | 09052798 A * | 2/1997 | C30B 29/36 |
| JP | 09-183700 | 7/1997 | |
| JP | 2000-154097 | 6/2000 | |
| JP | 2001-002499 | 1/2001 | |
| JP | 2002-284599 | 10/2002 | |
| JP | 2003-104798 | 4/2003 | |
| JP | 2005-126248 | 5/2005 | |
| JP | 2008-110907 | 5/2008 | |
| JP | 2008-159740 | 7/2008 | |
| JP | 2008-170744 | 7/2008 | |
| JP | 2009-091222 | 4/2009 | |
| WO | 03/038868 | 5/2003 | |
| WO | 2007/032051 | 3/2007 | |

OTHER PUBLICATIONS

Bauman et al., "Specific Features . . . in Vacuum", Electronic and Optical Properties of Semiconductors, XP008144777 vol. 35, No. 10, 2001, pp. 1132-1134.

Zinovcv et al., "Etching of . . . ambient pressure", Surface Science, 600 (2206) 2242-2251.

H.M. Hobgood et al., "Large diameter . . . device applications", Journal of Crystal Growth, 1994, vol. 137, pp. 181-186.

Tsunenobu Kimoto et al., "Surface Morphologic . . . Vapor Deposition", Jpn.J. Appl. Phys. vol. 40, 2001, pp. 3315-3319.

* cited by examiner

Fig. 3

SIC SINGLE CRYSTAL WAFER AND PROCESS FOR PRODUCTION THEREOF

TECHNICAL FIELD

This invention relates to a silicon carbide (SiC) single crystal wafer which is expected to be used as a material for low-loss, high-voltage semiconductor devices or as a material for hostile-environment semiconductor devices which are used at high temperatures or in an environment exposed to radiation. It also relates to a method for manufacturing the wafer. More specifically, the present invention relates to a SiC single crystal wafer which can realize a SiC semiconductor device of high reliability and high productivity and to a method for manufacturing the wafer.

BACKGROUND ART

Silicon carbide (SiC) is a class of compound semiconductors which are thermally and chemically stable. Compared to silicon (Si), SiC has advantageous physical properties such as a band gap which is approximately three times as large, a dielectric breakdown voltage which is approximately ten times as large, an electron saturation velocity which is approximately twice as large, and a coefficient of thermal conductivity which is approximately three times as large. On account of these excellent properties, SiC is expected to be used as a material for electronic devices which can overcome the limitations due to physical properties of Si devices, such as power devices and hostile-environment devices which operate at high temperatures.

In the field of optical devices, nitride-type materials (GaN and AlN) are being developed in order to make it possible to decrease the wavelength applied. Compared to other compound semiconductor materials, SiC has much smaller lattice mismatching with nitride-type materials, so it has attracted attention as a material for substrates on which a nitride-type material is grown.

Accordingly, there is a demand for good quality SiC single crystal wafers which can be used as devices or substrates and for an efficient manufacturing method therefor. To meet this demand, it is necessary to manufacture good quality SiC bulk single crystals (single crystal ingots) for use in the manufacture of wafers.

[Manufacture of SiC Bulk Single Crystals]

SiC single crystal wafers are manufactured by slicing wafers from a SiC bulk single crystal and processing the wafers by lapping (grinding to a uniform thickness), polishing (mirror finishing), and the like. These processes can be carried out in the same manner as for the manufacture of Si single crystal wafers, and they are known to those skilled in the art.

Known methods of manufacturing SiC bulk single crystals used in the manufacture of SiC single crystal wafers include the sublimation recrystallization method and the solution growth method.

SiC single crystal wafers which are currently commercially available are mainly manufactured by the sublimation recrystallization method. In this method, SiC powder which is a raw material is sublimated at a high temperature of 2200-2500° C. in a crucible made of graphite or the like, and a SiC single crystal is recrystallized on a seed crystal made of a SiC single crystal disposed in a low temperature region inside the crucible.

A SiC single crystal which is grown by the sublimation recrystallization method has the problem that it contains dislocations and micropipe defects which are continued from dislocations and micropipe defects in the seed crystal as well as a large number of dislocations which are thought to be generated during crystal growth. The following are thought to be causes of the generation of new dislocations during crystal growth. (1) The sublimation recrystallization method is basically a reaction which progresses inside a closed system in a crucible, so the composition of the sublimation gas which is supplied by sublimation of the SiC raw material varies during crystal growth. (2) Since the reaction takes place in a solid phase and a vapor phase, a large temperature gradient is present in the growth environment, and as a result, large thermal stresses develop in the crystal. (3) As crystal growth progresses, the growth interface moves within the crucible, so the temperature environment and the concentration of the sublimation gas which is a raw material vary over time.

As growth progresses, new defects are generated due to the above-described variation in crystal growth conditions. Therefore, it is extremely difficult to obtain a single crystal having a quality greatly exceeding that of the seed crystal by the sublimation recrystallization method. Furthermore, in the sublimation recrystallization method, because it is difficult to obtain a high purity raw material SiC powder or a high purity crucible, the SiC single crystals which are recrystallized are unavoidably contaminated by impurity elements such as boron and nitrogen. These impurities may induce dislocations within a SiC crystal, and it becomes difficult to produce a low-doped layer, which is necessary for the manufacture of devices, with good controllability.

In the solution growth method, carbon (C) is dissolved in a melt of Si or a Si alloy to prepare a SiC solution in the melt which serves as a solvent. The dissolution of C is allowed to proceed until the SiC dissolved in the solution is in a state of thermodynamic equilibrium with solid phase SiC (namely, the concentration of SiC in the solution reaches a saturated concentration). A SiC seed crystal is brought into contact with the resulting SiC solution (liquid phase), and a supersaturated state of SiC is formed at least in the vicinity of the seed crystal by supercooling the solution, thereby causing a SiC single crystal to grow on the seed crystal. A typical method of forming a supersaturated state is the so-called temperature difference method in which a temperature gradient is formed so that the temperature of the melt in the vicinity of the seed crystal is lower than the temperature in other areas of the melt.

The solution growth method, which is a liquid phase growth method, has excellent temperature controllability because the growth temperature can be lowered by around 500-1000° C. compared to the sublimation recrystallization method. Therefore, thermal stresses inside the crystal being grown can be made extremely low, and the occurrence of dislocations can be suppressed. Furthermore, crystal growth takes place in a state close to thermodynamic equilibrium, and it is possible to substantially eliminate variations in factors such as the composition of the solution during crystal growth. As a result, the generation of new dislocations during crystal growth can be nearly entirely eliminated, and it is possible to manufacture a good quality SiC bulk single crystal having markedly fewer dislocations or micropipe defects compared to when using the sublimation recrystallization method.

[Manufacture of SiC Single Crystal Epitaxial Wafers]

In order to manufacture SiC devices using a SiC single crystal wafer (also referred to as a bulk wafer) which is manufactured from a SiC bulk single crystal (single crystal ingot) manufactured by the above-described sublimation recrystallization method or solution growth method, the SiC single crystal wafer is used as a substrate, and on its surface, it is necessary to form a low-doped SiC single crystal epitaxial film or a single crystal epitaxial film of a Group III-V compound semiconductor including a nitride semiconductor such as GaN, with the epitaxial film being precisely controlled with respect to its concentration of impurities and thickness. A wafer having such an epitaxial film is referred to as an epitaxial wafer.

Known methods of forming a SiC epitaxial film for manufacturing an epitaxial wafer include the chemical vapor deposition (CVD) method and the liquid phase epitaxy (LPE) method. In the CVD method, silane gas and a hydrocarbon gas, which are raw material gases for SiC, are made to undergo thermal decomposition on a substrate to deposit a SiC film on the substrate. The LPE method is nearly the same as the above-described solution growth method. Namely, a SiC solution formed by dissolving C in a melt of Si metal or a Si alloy with at least one other metal is used as a liquid phase, and a substrate is brought into contact with the solution. The SiC concentration of the solution at least in the vicinity of the substrate is made a supersaturated state, thereby causing a SiC epitaxial film to grow on the substrate. In the LPE method, since crystal growth takes place in a state close to thermodynamic equilibrium, the density of crystal defects can be reduced.

It is known that the surface of a SiC single crystal wafer used as a substrate for epitaxial growth has an affected surface layer which is formed by transformation of the crystal structure of a good SiC single crystal. The affected surface layer is a layer containing a native oxide film or a subsurface damaged layer. A native oxide film is an oxide film which is formed in the surface of a SiC single crystal in the atmosphere. A subsurface damaged layer is a layer having damages in crystal structure which are introduced during the working process for manufacturing a SiC single crystal wafer from a bulk single crystal.

If an epitaxial film is grown on a SiC single crystal wafer having such an affected surface layer, regardless of which of the above-described methods for growing an epitaxial film is used, the quality and properties of the resulting epitaxial film are degraded. Therefore, a surface layer of a SiC single crystal wafer is removed prior to epitaxial growth. A known method for removing the surface layer is performed by removal of the damaged surface layer by oxidation followed by removal of the resulting oxide film. However, it is difficult to remove the oxide film without causing damages.

Patent Document 1 (JP 06-188163 A1) discloses a SiC single crystal substrate in which an affected surface layer of a SiC single crystal wafer is removed by means of dry etching. It is described therein that damaged portions which are dispersed in the surface of a wafer are uniformly removed by reactive ion etching (RIE) with an etching depth of 200-400 nm. It is also reported that if the etching depth exceeds 400 nm, the wafer surface becomes rough.

Patent Document 2 (JP 09-183700 A1) discloses a method of removing deep affected surface layers scattered on a wafer without producing surface roughening of the substrate while maintaining the flatness existing prior to etching. In this method, the wafer surface is etched using an ionized inert gas, and the resulting subsurface damaged layer which is newly formed by ion irradiation is removed by etching with a reactive gas. However, this method requires a plurality of etching steps, so it is inefficient.

Non-Patent Document 1 [Jpn. J. Appl. Phys., 40, 3315 (2001)] discloses carrying out in situ etching (namely, etching inside an epitaxial growth apparatus) of a SiC single crystal using $H_2$ gas to remove a surface layer of a wafer prior to epitaxial growth by the CVD method. When an epitaxial film is formed by CVD, this method is convenient since $H_2$ etching can be carried out inside a CVD apparatus, and it is currently widely used to remove an affected surface layer from SiC wafers. However, $H_2$ etching is difficult to apply to a method other than the CVD method (such as the LPE method) or to an apparatus for such other method. In addition, it is known that the density of surface defects which are generated when carrying out epitaxial growth greatly varies in accordance with the $H_2$ etching conditions and that surface defects are unavoidably generated in an epitaxial film even if etching conditions are optimized.

In actuality, if an affected surface layer of a SiC single crystal wafer like that described above is removed by a conventional removal method and then an epitaxial film is formed, there are still factors which degrade the quality of the epitaxial film. These factors cause a decrease in throughput (productivity) when manufacturing semiconductor devices from SiC single crystal wafers. From the standpoint of increasing throughput, there is a strong demand to identify the main factors causing a decrease in the quality of an epitaxial film and to eliminate them.

PRIOR ART DOCUMENTS

Patent Documents

Patent Document 1: JP 06-188163 A1
Patent Document 2: JP 09-183700 A1

Non-Patent Documents

Non-Patent Document 1: Jpn. J. Appl. Phys., 40, 3315 (2001)

SUMMARY OF THE INVENTION

The main object of the present invention is to provide a SiC single crystal wafer and a method for its manufacture which can realize a SiC semiconductor device of high reliability and high productivity by specifying the main causes of a decrease in the quality of an epitaxial film resulting from a SiC single crystal wafer when carrying out epitaxial growth on a SiC single crystal wafer and eliminating those causes.

The present invention provides a SiC single crystal wafer having in its surface an affected layer comprising Si, C, and O (oxygen) and having a non-single crystal structure, characterized in that the thickness of the affected layer is at most 50 nm, and the oxygen content in the SiC single crystal portion is at most $1.0 \times 10^{17}$ atoms/cm$^3$.

The present inventors performed investigations with the object of preventing a decrease in the quality of an epitaxial film formed on a SiC single crystal wafer. Specifically, they performed detailed investigations not only of the method and conditions of etching for pretreatment of a SiC single crystal wafer which were studied in the past, but they also studied the SiC single crystal wafer itself, namely, the properties of the SiC single crystal itself. In particular, they analyzed the microstructure of the extreme surface layer of a SiC single crystal wafer and performed detailed investigation of the content of impurity elements and the distribution of dislocations in a SiC single crystal wafer, and they investigated the relation of these factors to the properties of an epitaxial film formed on the wafer.

As a result, they found that even if surface treatment such as the above-described etching is previously carried out, the surface of a SiC single crystal wafer used as a substrate for epitaxial film growth which is obtained by conventional manufacturing methods has an affected layer (referred to below as an affected surface layer) which contains at least Si, C, and O and which has a crystal structure different from the structure of the SiC single crystal. Upon investigation of the affected surface layer, they made the following findings (1) and (2).

(1) With typical commercially available SiC single crystal wafers which are manufactured by the sublimation recrystallization method, the thickness of an affected surface layer which comprises a native oxide film and a subsurface damaged layer, which contains at least Si, C, and O, and which has a crystal structure which differs from that of a SiC single crystal varies from one wafer to another but is in the range of around 60-300 nm. The thickness of the affected surface layer and the variation in its thickness did not greatly vary whether surface finishing of the SiC single crystal wafer was performed by mechanical polishing or by CMP (chemical mechanical polishing).

Due to the thickness of an affected surface layer which greatly varies from one wafer to another, when etching is carried out to a certain fixed depth, the extent to which the affected surface layer remains varies from one wafer to another. Namely, when the thickness of the affected surface layer is comparatively small, the effect on degradation of the epitaxial film quality by the affected surface layer is small, but when the thickness of the affected surface layer is deep compared to the depth of etching, a considerable part of the affected surface layer remains and results in a decrease in the quality of the epitaxial growth film formed atop it.

In addition, the present inventors confirmed that when ex situ etching (namely, etching outside the epitaxial growth apparatus) is performed to remove the affected surface layer by the dry etching method or the like disclosed in the prior art, an affected surface layer rapidly reforms when the wafer is exposed to the atmosphere after etching.

(2) There have been attempts in the past to perform in situ removal of an affected surface layer prior to growth of an epitaxial film. This removal can be carried out by in situ hydrogen etching as disclosed in Non-Patent Document 1 when growth of an epitaxial film is carried out by CVD, and it can be carried out by back melting (prior to growth, a SiC wafer is brought into contact with a liquid phase containing carbon in an unsaturated concentration so that the wafer surface is dissolved in the liquid phase) in the case of LPE. However, it was found that with these removal methods, when the thickness of an affected surface layer containing Si, C, and O was large, a portion of the layer remained. It was confirmed that variations in the extent to which the layer remained produced variations in the properties of an epitaxial film subsequently grown on the wafer. Due to the crystal structure of the affected surface layer which is different from that of a SiC single crystal, if the affected surface layer remains in discrete locations in the wafer surface, it is thought that defects are generated within an epitaxial film which is grown atop these locations and bring about a degradation in the properties of the epitaxial film.

Performing thorough in situ removal of an affected surface layer before epitaxial growth so as to expose a good SiC crystal structure over the entirety of a wafer surface is thought to be an effective means of preventing the properties of an epitaxial film from worsening. However, in light of the variation in the thickness of an affected surface layer of a wafer, in situ removal requires etching to a depth of at least several hundred nanometers. Carrying out such deep etching leads to roughening of the wafer surface, and this surface roughening may produce a deterioration in the properties of an epitaxial film.

Based on the above findings, in order to provide a fundamental solution, the present inventors performed investigations concerning a method of manufacturing a SiC single crystal wafer which can control the thickness of an affected surface layer to a low value with certainty prior to removal of the affected surface layer.

As a result, they found that the thickness of an affected surface layer of a SiC single crystal wafer is related to the concentration of impurity oxygen in the SiC single crystal portion of the wafer excluding the affected surface layer. If the content of impurity oxygen in this single crystal portion is reduced to at most $1.0 \times 10^{17}$ atoms/cm$^3$, the thickness of the affected surface layer becomes at most 50 nm and can be markedly reduced compared to the thickness of an affected surface layer present of a conventional wafer.

The mechanism whereby the thickness of an affected surface layer (as described above, this layer comprises a subsurface damaged layer and a native oxide film) is reduced by decreasing the oxygen concentration in the SiC single crystal portion has not been elucidated, but it is hypothesized to be as follows. First, in the case of a subsurface damaged layer, a decrease in the oxygen concentration of a SiC single crystal increases the resistance of the single crystal to working, and this reduces the thickness of a subsurface damaged layer. On the other hand, a native oxide film is thought to be formed by the combined effect of surface segregation of oxygen in the SiC single crystal portion and native oxidation due to oxygen in the atmosphere. If the concentration of impurity oxygen in a SiC single crystal decreases, the amount of oxygen which segregates in the surface decreases, leading to a decrease in the thickness of a native oxide film.

If the thickness of an affected surface layer of a SiC single crystal wafer can be made at most 50 nm, in a surface layer removal step which is carried out prior to epitaxial growth by CVD or LPE, it is sufficient to perform in situ etching to a depth of 50 nm, and the occurrence of surface roughening and recurrence of an affected surface layer can be suppressed with certainty. As a result, it becomes possible to grow a good quality epitaxial film on the surface of a SiC single crystal wafer, and this leads to the realization of a SiC semiconductor device of high reliability and high productivity.

The crystal structure of an affected surface layer is different from that of the SiC single crystal portion. The affected surface layer includes a subsurface damaged layer having a crystal structure which has undergone damage due to working and a native oxide film. Therefore, it can be identified by analysis of the microcrystalline structure and analysis of the oxygen content (due to the native oxide film, it has a higher oxygen content than the single crystal portion). The thickness of the affected surface layer can be determined from a TEM image of a surface using a cross-sectional TEM (transmission electron microscope). It is also possible to additionally use elemental analysis which can analyze a surface or perform analysis in the thickness direction such as GDMS (glow discharge mass spectrometry) or SIMS (secondary ion mass spectroscopy). SIMS also can determine the oxygen content of a SiC single crystal portion underneath an affected surface layer.

In a preferred embodiment, the thickness of the affected surface layer is at most 30 nm, and the oxygen content of the single crystal portion excluding the affected surface layer is at most $5 \times 10^{16}$ atoms/cm$^3$. If the oxygen content in the crystal portion is at most $5 \times 10^{16}$ atoms/cm$^3$, the thickness of the affected surface layer can be further decreased to at most 30 nm. As a result, it is possible to simplify the process of removing the surface layer by pretreatment prior to growth by CVD or LPE.

More preferably, the thickness of the affected surface layer is at most 10 nm. In present day technology for ultramicroanalysis of impurities in SiC crystals, the detection limit for oxygen is $5\times10^{16}$ atoms/cm$^3$, so it is not possible to give an accurate value for how far the oxygen content in a SiC single crystal portion can be decreased. However, as a result of measuring the thickness of an affected surface layer, it was found that it is possible to decrease the thickness of the layer to 10 nm or less.

The diameter of a SiC single crystal wafer according to the present invention is preferably at least 2 inches. There are no particular limitations on the diameter of a SiC single crystal wafer as long as semiconductor devices can be manufactured therefrom. However, in order to efficiently manufacture devices from a single wafer, the wafer is preferably at least 2 inches in diameter. In order to make it possible to use existing semiconductor manufacturing equipment for Si or GaAs semiconductors, the wafer diameter is preferably at least 4 inches.

SiC is well known as a material having polytypes. Polytypes are a phenomenon in which many crystal structures which have the same stoichiometric to composition but which differ in the stacking manner of atoms only in the c-axis direction are possible. There are tens of SiC polytypes which are known, but the typical polytypes are 6H type (a hexagonal system having a period of 6 molecules), 4H type (a hexagonal system having a period of 4 molecules), and 3C type (a cubic system having a period of 3 molecules). For power devices, 4H-SiC is considered preferable in high and moderate power applications, and 3C-SiC is preferable in intermediate and low power applications. 6H-SiC has attracted attention as a wafer material for epitaxial growth of nitride materials (GaN, AlN). A SiC single crystal according to present invention is preferably a 3C-SiC, 4H-SiC, or 6H-SiC type. A SiC single crystal is essentially composed of a single crystal type, but as is known by those skilled in the art, SiC single crystals sometimes contain a slight amount of dislocations, subboundaries, and incorporation of other polytypes.

From another standpoint, the present invention provides a SiC single crystal wafer for use as a substrate for epitaxial growth of a SiC single crystal film, characterized in that the wafer does not have a subsurface damaged layer with a non-single crystal structure on the surface on which an epitaxial film is grown and its oxygen content is at most $1.0\times10^{17}$ atoms/cm$^3$.

From yet another standpoint, the present invention provides a SiC single crystal wafer for use as a substrate for epitaxial growth of a SiC single crystal film, characterized in that it is formed from the above-described SiC single crystal wafer having a surface on which an epitaxial film is grown and an affected surface layer has been removed from that surface. The affected surface layer is preferably substantially entirely removed, but it is possible for a portion thereof (such as at most 30% and preferably at most 10% of the thickness) to remain. As stated above, the thickness of an affected surface layer of an SiC single crystal wafer according to the present invention is at most 50 nm, preferably at most 30 nm, and more preferably at most 10 nm. Therefore, it is relatively easy to completely remove the affected surface layer with certainty by etching or the like, and such removal does not roughen the surface significantly. Methods of removing an affected surface layer will be described below.

The present invention also provides a SiC single crystal epitaxial wafer comprising a substrate made of a SiC single crystal wafer from which an affected surface layer was removed on a surface and an epitaxial film grown atop the surface from which the affected surface layer was removed, and a semiconductor device manufactured using this SiC single crystal epitaxial wafer. An epitaxial film can be grown by CVD, LPE, or other methods and there are no particular limitations on the method.

Examples of an epitaxial film are SiC single crystal films and particularly low-doped (n-type or p-type) SiC single crystal films (homoepitaxial films), and single crystal films of various Group III-V compound semiconductors and particularly nitride semiconductors (heteroepitaxial films). It is also possible to grow two or more layers of different epitaxial films.

An epitaxial wafer in which the epitaxial film is a SiC single crystal can be used to manufacture semiconductor devices which utilize the semiconductor properties of SiC itself. Alternatively, such epitaxial wafer can be used as a substrate to perform thereon heteroepitaxial growth of a different type of compound semiconductor film like that described below. When an epitaxial film is a low-doped SiC single crystal, the dopant which can be used may be N for an n-type semiconductor or B, Al, Ga, and the like for a p-type semiconductor.

A Group III-V nitride semiconductor is a compound semiconductor typically using B, Al, Ga, or In as a Group III element and N as a Group V element. Examples of this type of semiconductor are boron nitride (BN), aluminum nitride (AlN), gallium nitride (GaN), and indium nitride (InN). Among these, those other than BN, namely, AlN, GaN, and InN have the hexagonal wurtzite crystal structure which is stable at room temperature and atmospheric pressure, and their energy band structure is of the direct energy-gap type. Furthermore, the band gap energies at room temperature of these semiconductors are 6.2 eV, 3.4 eV, and approximately 0.8 eV, respectively. It is also possible to form a mixed crystal thereof (having the general formula $Al_xGa_yIn_{1-x-y}N$). Its band gap energy ranges from around 0.8 eV to 6.2 eV. Therefore, such a mixed crystal is expected to be used for light emitting devices or the like covering a broad range of wavelength from near infrared to far ultraviolet, and some are already being widely used.

Methods of manufacturing a semiconductor device from a SiC single crystal epitaxial wafer according to the present invention are known to those skilled in the art, and there are no particular limitations thereon in the present invention. As stated above, when an epitaxial film is SiC, it is expected to be applicable to power devices or electronic devices. When it is a Group nitride semiconductor, it is expected to be particularly applicable to optical devices.

A SiC bulk single crystal which is used to form a SiC single crystal wafer according to the present invention can be manufactured by the solution growth method, namely, a method comprising a step of preparing a liquid phase which can be in thermodynamic equilibrium with SiC by melting Si or Si and M (wherein M is at least one metal other than Si) which are raw materials and dissolving C in the resulting melt, and a step of bringing a seed crystal into contact with the liquid phase and forming a supersaturated state in the liquid phase at least in the vicinity of the seed crystal, thereby causing a SiC single crystal to grow on the seed crystal. In this method, by (1) making the oxygen concentration in the raw materials before melting at most 100 ppm and (2) making the oxygen concentration in the atmosphere surrounding the liquid phase at most 100 ppm during crystal growth, it is possible to obtain a SiC single crystal wafer in which the thickness of an affected surface layer and the oxygen content in the SiC single crystal portion excluding the subsurface damaged layer are both in the range defined by the present invention.

When the raw materials are Si and at least one metal M, the oxygen content of the raw materials is made the average of the oxygen content of each of the raw materials taking into consideration their proportion in the mixture. The oxygen concentration of the surrounding atmosphere can be determined by withdrawing the gas inside the apparatus to outside the furnace and measuring the oxygen concentration in the gas with an analyzer. It is also possible to incorporate a gas analyzer into the gas exhaust line from the apparatus and to perform measurement inside the line. There is the possibility of oxygen being discharged from materials inside the apparatus, so the oxygen concentration of the gas atmosphere inside the apparatus cannot be accurately measured based on the oxygen concentration in the gas entering the apparatus. When the oxygen concentration varies over time, it is possible to measure the average value of the oxygen concentration in the gas atmosphere during single crystal growth. It is permissible for the instantaneous oxygen concentration to exceed 100 ppm.

As a result of detailed investigation of the source of impurity oxygen contained in SiC single crystals, it was found that a major source of oxygen is impurity oxygen in raw materials in the form of Si or Si and another metal M, and impurity oxygen present in the surrounding atmosphere when melting the raw materials to form a liquid phase. It was found that by limiting the level of impurity oxygen in the raw materials and the atmosphere to at most 100 ppm each, the impurity oxygen content of the resulting SiC single crystal (excluding the affected surface layer) can be limited to at most $1.0 \times 10^{17}$ atoms/cm$^3$. As a result, it is possible to manufacture a SiC single crystal wafer having an affected surface layer with a thickness of at most 50 nm.

The raw materials used for melting are preferably melted after removing an oxide film present on their surface by chemical etching or heat treatment under a high vacuum (less than $1 \times 10^{-2}$ Pa) inside the crystal growth furnace at a temperature lower than their melting points (namely, without melting the raw materials). The atmosphere when melting the raw materials is preferably an inert gas such as argon or helium. The temperature at which the raw materials are melted is at least 1414° C. which is the melting point of Si when Si is solely used as the raw material, and in the case of a Si-M alloy, it can be widely varied from 900-2000° C. or above depending upon the metal element M which is selected and the alloy composition. However, in order to stably grow a SiC single crystal at a practical growth rate, it is preferably a temperature within the range of 1600-1900° C.

By making either the impurity oxygen content of the raw materials or the impurity oxygen concentration in the atmosphere at most 1 ppm, the impurity oxygen content of the SiC single crystal can be reduced to at most $5 \times 10^{16}$ atoms/cm$^3$, and a SiC single crystal wafer having an affected surface layer with a thickness of at most 30 nm is obtained. If the impurity oxygen content of both the raw materials and the atmosphere is made at most 1 ppm, the impurity oxygen content of the SiC crystal can be further decreased, and it becomes possible to manufacture a SiC single crystal wafer having an extremely thin affected surface layer with a thickness of at most 10 nm.

When using a SiC single crystal wafer having a thin affected surface layer which is obtained in this manner as a substrate and growing an epitaxial film on its surface, the affected surface layer is first removed from the surface of the substrate on which an epitaxial film is to be grown. Due to the thinness of the affected surface layer, if at most 50 nm of thickness is removed, a surface from which the affected surface layer is completely removed is obtained, and it is possible to stably grow a good quality epitaxial film by carrying out epitaxial growth on this surface.

In this manner, it becomes possible to perform good quality epitaxial growth by using a SiC single crystal wafer according to the present invention, and the manufacture of a SiC semiconductor device of high reliability and high productivity can be realized. It has also been found that a SiC semiconductor wafer according to the present invention has the below-described unexpected effects which were not initially supposed.

Ohmic contacts perform the function of connecting the body of a semiconductor device and wiring formed atop a wafer. In general, ohmic contacts are essential in semiconductor devices. Among vertical power devices, Schottky barrier diodes (SBD) and the like have cathode contact regions and drain contact regions for forming ohmic contacts formed on the rear surface of a wafer.

Because the resistance produced by ohmic contacts increases the heat losses of a semiconductor device and worsens the device properties, it is desirable to reduce this resistance to a level which can be ignored compared to the resistance of the device itself. The main cause of the occurrence of contact resistance is a Schottky barrier present in the interface between electrodes and a SiC semiconductor. This is an inherent cause, and it is highly difficult to form a contact with a low resistance in a wide band gap semiconductor such as a SiC semiconductor.

A method which has been proposed in the past of forming ohmic contacts on SiC semiconductors is one in which a high concentration doped region of a SiC single crystal is subjected to vapor deposition of a metal such as Ni, Ti, or Co in the case of an n-type semiconductor or a metal such as Al or B in the case of a p-type semiconductor and then to heat treatment at around 1000° C. to reduce the resistance between SiC and a reaction layer which is formed. In the past, because it was necessary to expose a good semiconductor structure on the surface prior to forming a contact, various types of pretreatment were carried out on the surface of a SiC semiconductor (see "Silicon Carbide Recent Major Advances", W. J. Choyke et al Eds., p. 653). This is because the presence of electrically insulating foreign matter in the surface layer produces a contact resistance, and it is not possible to form a good ohmic contact. Namely, when directly forming an ohmic contact on a surface which has not undergone removal of an affected surface layer by pretreatment (and on which an epitaxial film is also not formed) (for example, when forming an ohmic contact on the rear surface of a SBD which is a vertical power device), it has thus far been difficult to form a good ohmic contact.

In contrast, with a SiC single crystal wafer according to the present invention, the thickness of an affected surface layer on it surface is less than 50 nm, and the oxygen content of the single crystal portion excluding the affected surface layer is at most $1.0 \times 10^{17}$ atoms/cm$^3$. With an epitaxial wafer having this SiC single crystal wafer as a substrate, it was found that it is possible to form a good ohmic contact even on a surface such as the rear surface of the wafer from which an affected surface layer is not removed by special pretreatment of the wafer.

When the interface having good ohmic contact properties between a SiC wafer and a metal which is a contact material was investigated in detail by means of cross-sectional TEM, an affected surface layer was not observed on the wafer surface, and oxygen was not detected by means of TEM-EDX. This is thought to be because a surface oxide film of the wafer was effectively reduced by the metal which is the contact material and oxygen was diffused in atomic state into the contact material.

In a conventional wafer having a thick affected surface layer exceeding 50 nm, as stated above, it was not possible to obtain good ohmic properties unless pretreatment of the wafer was carried out. By using a SiC wafer according to the present invention, marked effects (which could not be predicted by those skilled in the art) that it becomes possible to simplify the surface pretreatment step at the time of forming ohmic contacts on the rear surface and that it becomes possible to efficiently manufacture a SiC semiconductor device are produced.

When a SiC single crystal wafer according to the present invention is used as a substrate and an epitaxial film is grown on its one surface, a degradation in the quality of the epitaxial film caused by the SiC single crystal wafer which is a substrate does not readily occur. As a result, it becomes possible to manufacture a SiC semiconductor device or a Group III-V compound semiconductor device of high reliability and high productivity. In addition, special pretreatment of the surface becomes unnecessary when forming ohmic contacts on the rear surface of a wafer, and it becomes possible to simplify the step of forming ohmic contacts.

1: melt, 2: crucible, 3: seed shaft, 4: seed crystal, 5: crucible lid, 6: heat insulator, 7: high frequency coil, 8: water cooled chamber, 9: gas inlet, 10: gas outlet, 11: gate valve, 12: preparation chamber, 13: gas inlet, 14: gas outlet

MODES FOR CARRYING OUT THE INVENTION

An example of the solution growth method for manufacturing a SiC single crystal (bulk single crystal) which is used as a material for manufacturing a SiC single crystal wafer according to the present invention characterized in that an affected surface layer with a non-single crystal structure containing Si, C, and O has a thickness of at most 50 nm and in that the single crystal portion excluding the to affected surface layer has an oxygen content of at most $1.0 \times 10^{17}$ atoms/cm$^3$ is first explained.

Figure 1:
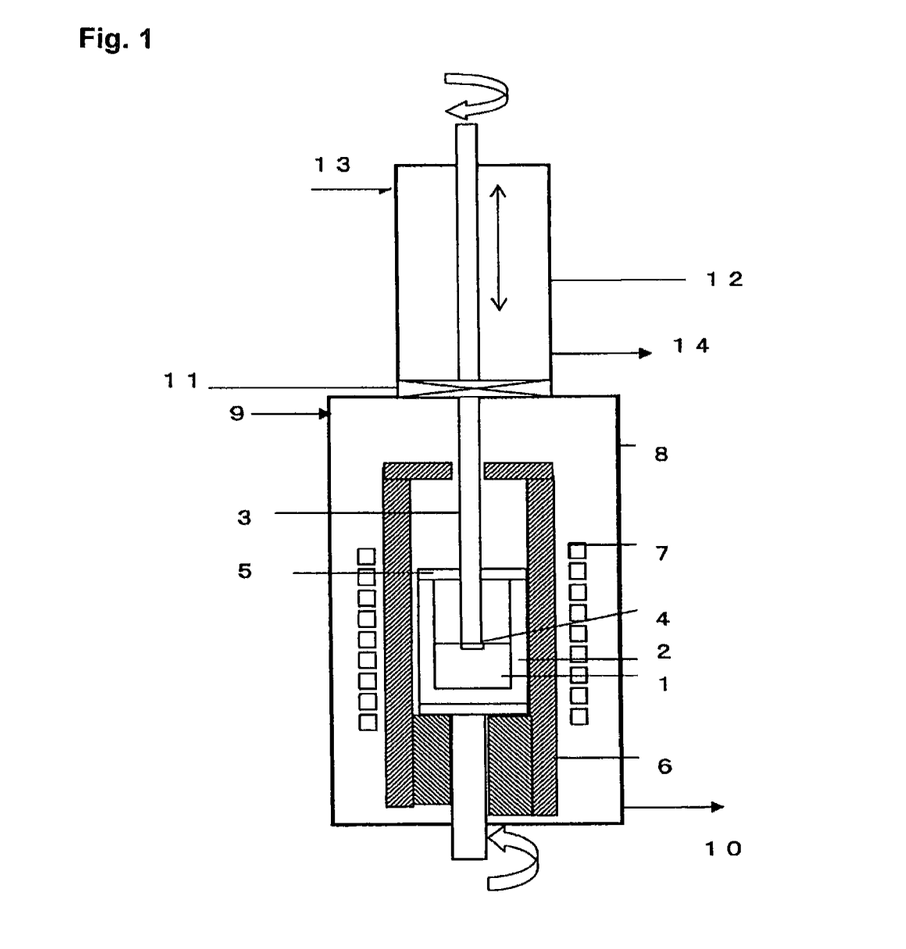
FIG. 1 is a schematic cross-sectional view of a single crystal manufacturing apparatus which can be used to manufacture a SiC single crystal.

FIG. 1 schematically shows a manufacturing apparatus used to manufacture this SiC single crystal. The single crystal manufacturing apparatus of FIG. 1 has a crucible 2 which contains a melt 1, and a SiC seed crystal 4 which is held at the tip of a seed shaft 3 which can be raised and lowered contacts the melt 1. The crucible 2 and the seed shaft 3 can be rotated independently of each other.

The crucible 2 is closed off by a crucible lid 5 through which the seed shaft 3 passes. The outer periphery of the crucible 2 is surrounded by a heat insulator 6 in order to maintain its temperature. A high frequency coil 7 for induction heating of the crucible and the melt is disposed around the heat insulator 6. In order to carry out crystal growth by the temperature difference method, a temperature gradient can be provided in the vertical direction of the melt 1 by adjusting the number and spacing of windings of the high frequency coil 7 and its positional relationship with respect to the crucible 2 so that the vicinity of the surface of the melt at which the seed crystal 4 contacts the melt can be made to be at a lower temperature than the lower portion of the melt.

Since the crucible 2, the heat insulator 6, and the high frequency coil 7 reach a high temperature, they are disposed inside a water cooled chamber 8. The water cooled chamber 8 has a gas inlet 9 and a gas outlet 10 for adjusting the atmosphere inside the manufacturing apparatus. Although not shown in the drawing, a plurality of pyrometers may be provided so as to pass along the gaps in the high frequency coil and through the heat insulator 6, whereby the temperature of the side wall of the crucible 2 may be measured at a plurality of heights along the crucible 2.

A preparation chamber 12 which can be partitioned off by a gate valve 11 is provided above the water cooled chamber 9. The preparation chamber is also water cooled. The preparation chamber has a gas inlet 13 and a gas outlet 14 which are independent of the water cooled chamber 9. Using this preparation chamber 12, a getter (not shown) which captures impurity gas or a crucible 2 which contains raw materials including Si can be introduced into the water cooled chamber 9 without exposing the atmosphere inside the chamber 9 to the ambient air.

The melt 1 can be prepared by melting raw materials in the form of only Si or a mixture of Si and at least one other metal M and dissolving C in the resulting melt. Accordingly, the melt contains Si, C, and optionally a metal M. The melt is a SiC solution having molten Si or molten Si and M as a solvent. The content of C in the melt is such that the SiC concentration in the melt is close to a state of thermodynamic equilibrium with solid phase SiC (in other words, it is close to a saturated concentration).

As stated above, the Si and optionally a metal M which are used as the raw materials of a melt have an oxygen content of at most 100 ppm. Even if high purity raw materials are used, an oxide film due to natural oxidation is present on the surface of the raw materials in the form of Si and the metal M, and the oxygen concentration of the raw materials may exceed 100 ppm unless this oxide film is removed.

Therefore, after the raw materials are charged into the single crystal manufacturing apparatus, a native oxide film on the surface of the raw materials is preferably removed by carrying out preliminary heat treatment under a high vacuum (less than $1 \times 10^{-2}$ Pa) and at a temperature lower than the melting temperature of the raw materials, and then the raw materials are melted. Alternatively, a surface oxide film on the raw materials can be removed by previously performing chemical etching, and then the raw material can immediately be melted. It is simpler to remove an oxide film inside the crucible, so this method is preferred. Removal of a surface oxide film by chemical etching is carried out using an etching solution suitable for the type of metal oxide film formed on the surface. For example, it can be carried out using hydrofluoric acid in the case of a Si oxide film.

There are no particular limitations on the type of metal M as long as it can form a liquid phase (a SiC solution) which is in thermodynamic equilibrium with SiC (solid phase). A preferable metal is one which can increase the growth rate of a SiC single crystal compared to when the melt consists only of Si. Examples of a suitable metal M are Ti, Mn, Cr, Co, V, Fe, and the like. A particularly preferred metal M is Ti or Mn, and of these, Ti is preferred. A preferred atomic ratio of the alloying element M when the composition of a Si-M alloy is expressed as $Si_{1-x}M_x$ is $0.1 \leq x \leq 0.25$ when M is Ti and is $0.1 \leq x \leq 0.7$ when M is Mn. When the metal M is another metal, a suitable proportion of M can be decided taking into consideration the dissolving power for C and the melting temperature.

Several methods can be used to supply C to the melt. In the most typical method, the entire crucible 2 is formed from ultrahigh purity graphite or SiC or at least the inner surface of the crucible is coated with a layer of ultrahigh purity graphite or SiC, and C is supplied to the melt by dissolution of the crucible. This method avoids the presence of undissolved C in the melt. Alternatively, C by itself or C and Si can be added as solids to the melt from outside the crucible, or a hydrocarbon gas such as methane or propane can be introduced into the furnace, thereby producing C by thermal decomposition of the gas at the surface of the melt consisting of Si or Si and a metal M and dissolving the resulting C into the melt. Two or more of these methods of supplying C may be used together.

The heat insulator 6 can be a molded heat insulator of a fibrous material (such as one made of graphitic carbon fibers) or a non-fibrous material. In order to prevent contamination of the melt by scattering of particles or the like from such heat insulator, it is preferable to use a heat insulator which is housed in a vessel made of graphite or graphite having its surface coated with SiC, TaC, or the like. Use of the heat insulator is extremely desirable for maintaining a high heating efficiency when carrying out growth of a crystal having a diameter of at least 2 inches.

Before the raw materials for solution growth of a SiC single crystal which is used to form a wafer according to the present invention are charged into the crucible, it is preferred that heating of members inside the apparatus such as the heat insulator and the crucible in an evacuated state (referred to below as preheating) be previously carried out such that gas which is discharged from these members at the time of heating is previously exhausted to outside of the apparatus as much as possible. The preheating temperature is preferably at least 50° C. higher than the temperature at the time of crystal growth. Even if the preheating temperature is made much higher than the growth temperature, the effect produced by previously exhausting gas reaches saturation, so it is sufficient for the preheating temperature to be 50-150° C. higher than the growth temperature. For example, when the crystal growth temperature is 1750° C., a preferred range for the preheating temperature is 1800-1900° C.

The raw materials are then introduced. Prior to introducing the raw materials, the temperature inside the furnace is lowered to a temperature below the melting point of the raw materials. After the raw materials are introduced, heat treatment is preferably carried out as described above under a high vacuum and at a temperature lower than the melting temperature to remove a surface oxide film from the raw materials and reduce the oxygen concentration of the raw materials to at most 100 ppm, preferably at most 10 ppm, and more preferably at most 1 ppm. The heating temperature for this oxide film removal is preferably around 1200-1400° C. A high purity inert gas like that described below is then introduced into the apparatus (into the water cooled chamber), and heating is performed to a temperature higher than the melting temperature of the raw materials to form a melt 1 and dissolve C in the melt until the concentration of SiC in the melt reaches close to thermodynamic equilibrium with solid phase SiC. In this manner preparation for growth of a SiC single crystal is completed. It is preferable to use a rare gas as the inert gas, and typically argon or helium is used.

Then, in accordance with a conventional manner, a SiC seed crystal 4 which is held at the tip of the seed shaft 3 is brought into contact with the melt 1, and a temperature gradient is formed in the melt 1 such that the vicinity of the seed crystal is at a lower temperature (for example, a vertical temperature gradient so that the temperature decreases as the height increases) and such that a supersaturated state is formed by supercooling in the vicinity of the seed crystal, thereby causing a SiC single crystal to grow on the seed crystal. Instead of the temperature difference method, it is possible to employ a method in which the temperature of the entire melt is lowered so as to form a supersaturated state, and if necessary, the temperature is repeatedly raised and lowered. For the purpose of increase the uniformity and speed of crystal growth, one or both of the crucible and the seed shaft can be rotated at a constant speed or at periodically accelerated and decelerated speed. When rotating both the crucible and the seed shaft, their rotational directions are preferably opposite of each other.

In order to control the atmosphere surrounding the melt and accordingly the atmosphere inside the apparatus so as to have an oxygen concentration of at most 100 ppm and in view of oxygen which is discharged from the raw materials or members inside the apparatus, it is preferred that the inert gas which is introduced into the apparatus be one with an impurity oxygen gas content of at most 100 ppb. The oxygen gas content is more preferably at most 10 ppb. Such a gas can be realized by introducing a commercially available inert gas into the apparatus after passing it through a gas purifier. The inert gas which is introduced into the apparatus is contaminated by impurity gas which is discharged at the time of heating from members inside the manufacturing apparatus, so the concentration of impurity oxygen in the atmosphere during actual crystal growth needs to be determined by an ultrahigh precision gas analyzer installed in the gas exhaust line from the manufacturing apparatus.

In this manner, a SiC bulk single crystal having high workability with an oxygen content of at most $1.0 \times 10^{17}$ atoms/cm³ and preferably at most $5 \times 10^{16}$ atoms/cm³ can be manufactured by the solution growth method in which the oxygen concentration of each of the raw materials and the surrounding atmosphere gas is limited to at most 100 ppm. When a wafer is manufactured in a conventional manner from this low oxygen SiC bulk single crystal, surface oxidation and formation of a subsurface damaged layer are suppressed, and a SiC single crystal wafer according to the present invention having an affected surface layer with a thickness of at most 50 nm, preferably at most 30 nm, and more preferably at most 10 nm is obtained.

When manufacturing an epitaxial wafer using this SiC single crystal wafer as a substrate, first, the substrate SiC single crystal wafer is treated to remove the affected surface layer from the surface of the wafer on which an epitaxial film is to be grown. Removal of the affected surface layer is preferably carried out in situ, namely, inside the epitaxial film growth apparatus. As stated above, when CVD is employed to grow an epitaxial film, this removal can be carried out by in situ hydrogen etching, and when LPE is employed, it can be carried out by back melting. Since the thickness of the affected surface layer is an extremely small value of at most 50 nm and can be easily predicted, the thickness which must be removed can be easily determined, and the affected surface layer can be completely removed. Furthermore, because only shallow removal is required, roughening of the surface caused by removal is suppressed. As a result, it is possible to grow a good quality epitaxial film, and accordingly it is possible to manufacture a semiconductor device of high reliability.

EXAMPLES

In the following examples, a SiC bulk single crystal was grown by the solution growth method using the single crystal manufacturing apparatus shown in FIG. 1. This single crystal manufacturing apparatus had a graphite crucible 2 (inner diameter of 130 mm), and the outer periphery of the graphite crucible was surrounded by a fibrous molded heat insulator 6. A high frequency coil 7 for induction heating was disposed around the heat insulator. The atmosphere inside the single crystal manufacturing apparatus could be controlled using a gas inlet 9 and a gas outlet 10.

In these examples, removal of a surface oxide film on the raw materials was carried out by chemical etching in order to determine the impurity oxygen concentration in the raw materials being used prior to introducing the raw materials into the crucible. The chemical etching was carried out using an etching solution which was hydrofluoric acid for removal of a Si oxide film or hot nitric acid for removal of a Ti oxide film.

Example 1

In this example, raw materials for a melt in the form of Si and Ti in the ratio Si:Ti=80:20 (atomic ratio, namely, at %) were charged into a graphite crucible 2, and they were melted by high frequency induction heating to prepare a melt serving as a solvent. The concentration of impurity oxygen in the Si and Ti used as the raw materials in bulk form (powder) was an average of 60 ppm including a surface oxide film. These raw materials were obtained by completely removing a surface to oxide film from commercial Si and Ti by chemical etching. Before the Si and Ti were charged and melted in the crucible, the crucible and the heat insulator underwent baking by heating for 5 hours at 1880° C. under a high vacuum to previously evacuate the gas which would be discharged from members of the apparatus during heating as much as possible. The vacuum which was reached at this time was $1 \times 10^{-2}$ Pa.

Carbon was supplied to the melt by being dissolved from the graphite crucible. In order to dissolve carbon in the Si—Ti melt which was a solvent before carrying out single crystal growth, while an inert gas at atmospheric pressure was sealed inside the single crystal manufacturing apparatus, the graphite crucible and the melt were heated for approximately 2 hours at 1800° C., whereby a sufficient amount of carbon was dissolved until the SiC concentration in the melt was close to a state of thermodynamic equilibrium with solid solution SiC. Commercially available helium gas with an oxygen concentration of 100 ppb was used as the inert gas. The oxygen concentration in the gas was measured by an ultrahigh precision gas analyzer (plasma gas analyzer) installed in the inert gas exhaust line to monitor the oxygen concentration in the apparatus.

After a sufficient amount of C was dissolved in the melt, a seed crystal which was a 4H-SiC single crystal with a diameter of 51 mm and which was held at the tip of a seed shaft 3 was immersed in the melt 1 close to the melt surface and contacted with the melt. By previously varying the relative position of the high frequency coil and the graphite crucible as well as the structure of the heat insulator disposed on the outer periphery of the graphite crucible, the temperature was adjusted so as to form a temperature gradient in the melt such that the temperature at the surface of the melt was lower than inside the melt, and growth of a SiC single crystal was carried out for 50 hours by the temperature difference method. The temperature of the melt at the location of crystal growth was made 1800° C., and the temperature inside the melt was made 1830° C. (temperature gradient: 15° C./cm, ΔT: 30° C./2 cm). The crucible 2 and the seed shaft 3 were rotated in opposite directions at a speed of 20 rpm. The concentration of impurity oxygen in the surrounding atmosphere during crystal growth was an average of 80 ppm as measured in the gas exhaust line.

After completion of the growth experiment, the seed shaft 3 was raised, and the single crystal was removed from the melt 1 and obtained. The melt in the crucible was solidified by cooling to room temperature. The obtained SiC single crystal had solidified matter from the melt which adhered to the surface of the crystal. The solidified matter was removed with nitrofluoric acid (HF+HNO$_3$). 4H-SiC on-axis single crystal wafers with a diameter of 2 inches (50.8 mm) were manufactured from the resulting SiC bulk crystal (thickness of 5 mm) by a conventional method. The wafer surface was finished by CMP.

Figure 2:
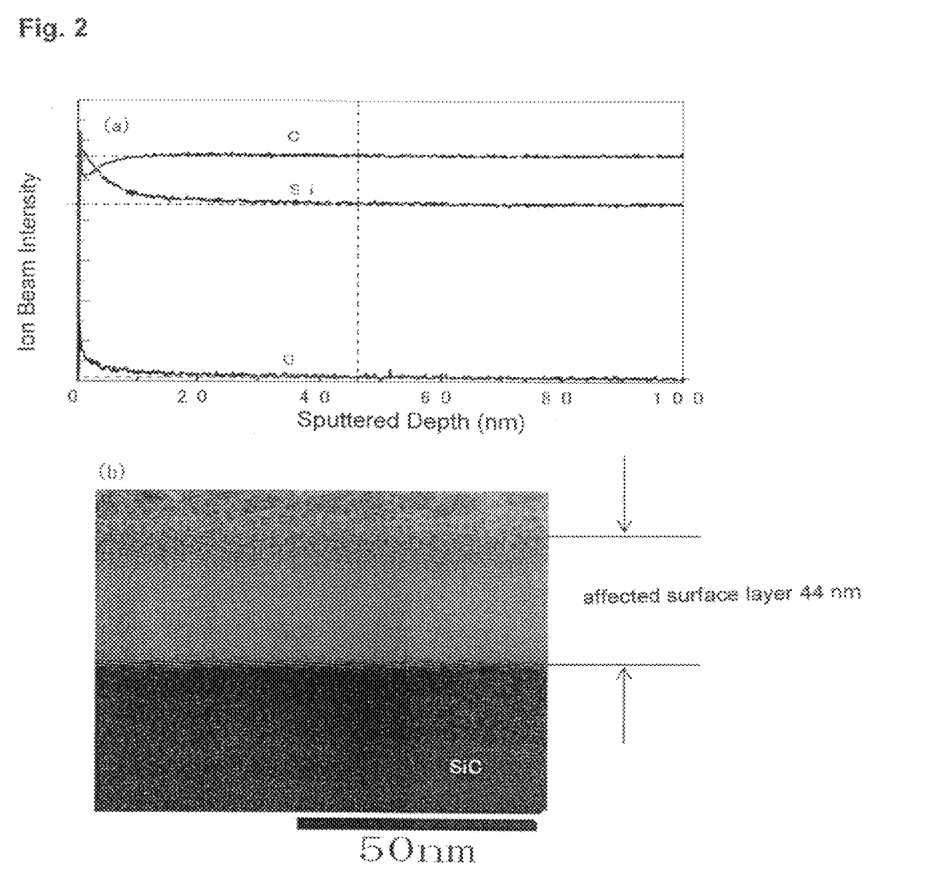
FIG. 2(a) shows the depth profile obtained by GDMS of a SiC single crystal wafer manufactured in Example 1.
FIG. 2(b) shows a cross-sectional TEM image thereof.

The microstructure of the surface layer of one of the wafers was analyzed by cross-sectional TEM, and impurities in the surface layer were analyzed by GDMS and SIMS. Impurities inside the wafer were analyzed by SIMS. It was found that an affected surface layer having Si, C, and O as main constituent elements and having a thickness of 44 nm was present on the surface of the SiC wafer which was manufactured in this example. FIG. 2(a) shows the GDMS depth profile, and FIG. 2(b) shows a cross-sectional TEM image. The impurity oxygen concentration of the SiC single crystal portion excluding the affected surface layer was found to be $9.5 \times 10^{16}$ atoms/cm$^3$ by SIMS analysis.

Using a wafer from the remaining SiC single crystal wafers as a substrate, a SiC epitaxial film was grown on the substrate by the liquid phase epitaxy method using Si as a solvent in a manner which will be outlined below.

First, Si chips were charged into a crucible made of high purity graphite and were heated in a high frequency induction heating furnace to form a Si melt. The melt was held for 2 hours to dissolve a sufficient amount of carbon from the graphite crucible. A 4H-SiC on-axis single crystal wafer manufactured in this example was then immersed in the melt. A temperature gradient of approximately 10° C./cm was formed in the vertical direction of the melt. Immediately after immersion, the 4H-SiC on-axis single crystal wafer which was the substrate was maintained for 5 minutes in the high temperature region of the melt to carry out back melting of the affected surface layer of the wafer into the melt. The wafer was then moved to the surface layer of the melt, and liquid phase epitaxial growth to was commenced. The epitaxial growth temperature was 1700° C., and the duration of growth was one hour. A SiC liquid phase epitaxial film with a thickness of approximately 10 μm was obtained by this epitaxial growth.

The state of occurrence of surface defects in the SiC epitaxial film was observed with a confocal microscope and evaluated as follows. A case in which the occurrence of surface defects was the same as when epitaxial growth was carried out on a conventional wafer (a commercial SiC wafer manufactured by the sublimation recrystallization method) was evaluated as poor, a case in which the occurrence of surface defects decreased to 1/10 or less was evaluated as good, and a case in which surface defects were not observed was evaluated as excellent.

In order to check for ohmic contact, vapor deposition of Ni/Ti metals was carried out on the rear surface of a wafer to be tested, and after the wafer was annealed at 1000° C., the contact properties were investigated by TLM (transfer length method). A case showing ohmic properties was evaluated as "Yes" and a case showing Schottky properties was evaluated as "No". The test results are shown in Table 1.

Example 2

SiC single crystal wafers (with a thickness of 350 μm) were manufactured in the same manner as in Example 1 except that the raw material placed into the graphite crucible was only Si (the residual oxygen concentration in the raw material Si was 1 ppm, and the surface oxide layer of this material was partially removed by previously performing chemical etching).

An affected surface layer having Si, C, and O as main constituent elements and having a thickness of 38 nm was present on the surface of the resulting SiC wafers. The concentration of impurity oxygen in the SiC single crystal portion excluding the affected surface layer was found by SIMS analysis to be $7.8 \times 10^{16}$ atoms/cm$^3$. A SiC epitaxial film was formed atop these SiC single crystal wafers by the liquid phase epitaxy method and evaluated in the same manner as described in Example 1. The results are shown in Table 1.

Example 3

SiC single crystal wafers were manufactured in the same manner as in Example 1 except that the raw material placed into the graphite crucible was only Si (the residual oxygen concentration in the raw material was 100 ppb, and the surface oxide layer of this material was completely removed by previously performing chemical etching). An affected surface layer having Si, C, and O as main constituent elements and having a thickness of 28 nm was present on the surface of the resulting SiC single crystal wafers. The concentration of impurity oxygen in the SiC single crystal portion excluding the affected surface layer was found by SIMS analysis to be $5.0 \times 10^{16}$ atoms/cm$^3$. A SiC epitaxial film was formed atop these SiC single crystal wafers by the liquid phase epitaxy method and evaluated in the same manner as described in Example 1. The results are shown in Table 1.

Example 4

The raw materials placed into a graphite crucible were Si and Ti (the residual oxygen concentration in the raw materials Si and Ti was an average of 80 ppm, and the surface oxide layer of these materials was partially removed by previously performing chemical etching), and before melting the Si and Ti in a crucible, the crucible and heat insulator underwent baking by heating for 10 hours at 1880° C. under a high vacuum to exhaust as much gas discharged from the members of the apparatus during heating. The vacuum reached at this time was $4 \times 10^{-3}$ Pa. High purity helium gas with an oxygen concentration of 100 ppb was then introduced into the crystal manufacturing apparatus after it was passed through a gas purifier. The impurity oxygen concentration in the ambient atmosphere during crystal growth which was measured in the gas exhaust line was found to be an average of 200 ppb. SiC single crystal wafers were manufactured by a method that was otherwise the same as in Example 1. An affected surface layer having Si, C, and O as main constituent elements and having a thickness of 29 nm was present on the surface of the resulting SiC single crystal wafers. The impurity oxygen concentration of the SiC single crystal portion excluding the affected surface layer was found by SIMS analysis to be $5.0 \times 10^{16}$ atoms/cm$^3$. A SiC epitaxial film was formed by the liquid phase epitaxy method atop these SiC single crystal wafers and evaluated in the same manner as described in Example 1. The results are shown in Table 1.

Example 5

SiC single crystal wafer were manufactured by the same method as in Example 1 except that the raw material placed into the graphite crucible was only Si (the residual oxygen concentration in the raw material Si was 100 ppb, and the surface oxide film of the material was completely removed by previously performing chemical etching), and the average impurity oxygen concentration in the atmosphere during crystal growth was 200 ppb. An affected surface layer having Si, C, and O as main constituent elements and having a thickness of 9 nm was present on the surface of the resulting SiC single crystal wafers. The impurity oxygen concentration of the SiC single crystal portion excluding the affected surface layer was found by SIMS analysis to be less than the limit of detection (less than $5.0 \times 10^{16}$ atoms/cm$^3$). A SiC epitaxial film was formed by liquid phase epitaxy on these SiC single crystal wafers and was evaluated in the same manner as described in Example 1. The results are shown in Table 1.

Comparative Example 1

SiC single crystal wafers were manufactured in the same manner as in Example 1 except that the raw materials placed into the graphite crucible were Si and Ti (the residual oxygen concentration in the raw materials Si and Ti was an average of 300 ppm, and both were as-purchased commercial products), and the impurity oxygen concentration in the atmosphere during crystal growth was 150 ppm (baking prior to melting the raw materials to exhaust a gas discharged from the members of the apparatus was not carried out). An affected surface layer having Si, C, and O as main constituent elements and having a thickness of 60 nm was present on the surface of the resulting SiC single crystal wafers. The impurity oxygen concentration of the SiC single crystal portion excluding the affected surface layer was found by SIMS analysis to be $1.2 \times 10^{17}$ atoms/cm$^3$.

Comparative Example 2

Figure 3:
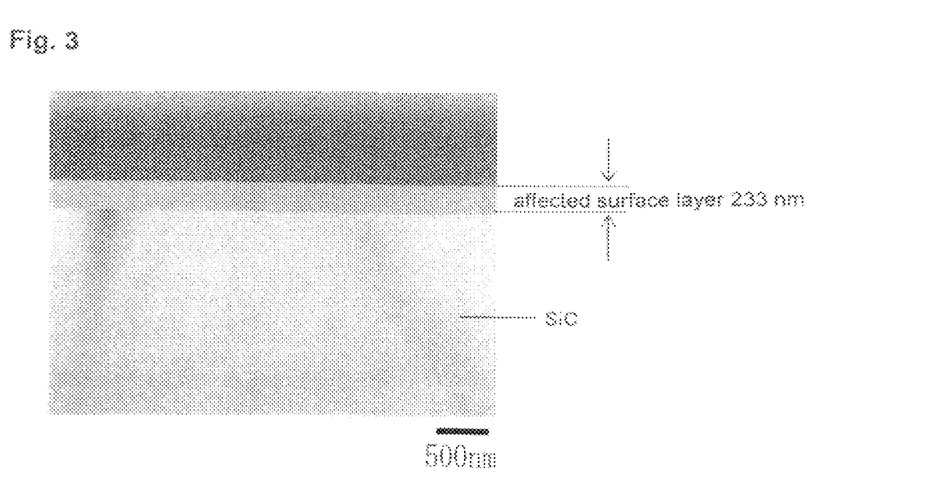
FIG. 3 shows a cross-sectional TEM image of the surface layer of a SiC single crystal wafer manufactured in Comparative Example 2.

The microstructure of the surface of a commercially available SiC single crystal wafer manufactured by the sublimation recrystallization method was analyzed using a cross-sectional TEM, and impurities in the surface were analyzed by GDMS and SIMS. In addition, impurities inside the wafer were analyzed by SIMS. As a result, an affected surface layer having Si, C, and O as main constituent elements and having a thickness of 233 nm was present on the surface of the SiC single crystal wafer of Comparative Example 2 (see FIG. 3). The impurity oxygen concentration of the SiC single crystal portion excluding the affected surface layer was found by SIMS analysis to be $2.0 \times 10^{17}$ atoms/cm$^3$.

TABLE 1

|  | Thickness of affected surface layer on wafer (nm) | Impurity oxygen concentration of single crystal portion of wafer (atoms/cm$^3$) | Type of solvent (% = at %) | Quality of epitaxial film on wafer | Ohmic contacts | Comment |
|---|---|---|---|---|---|---|
| Ex. 1 | 44 | $9.5 \times 10^{16}$ | 20% Ti—80% Si | Good | Yes | |
| Ex. 2 | 38 | $7.8 \times 10^{16}$ | Si | Good | Yes | |
| Ex. 3 | 28 | $5.0 \times 10^{16}$ | Si | Excellent | Yes | |
| Ex. 4 | 29 | $5.0 \times 10^{16}$ | 20% Ti—80% Si | Excellent | Yes | |
| Ex. 5 | 9 | $<5.0 \times 10^{16}$ | Si | Excellent | Yes | |

TABLE 1-continued

|  | Thickness of affected surface layer on wafer (nm) | Impurity oxygen concentration of single crystal portion of wafer (atoms/cm³) | Type of solvent (% = at %) | Quality of epitaxial film on wafer | Ohmic contacts | Comment |
|---|---|---|---|---|---|---|
| Comp. 1 | 60 | $1.2 \times 10^{17}$ | 20% Ti—80% Si | Poor | No |  |
| Comp. 2 | 233 | $2.0 \times 10^{17}$ | — | Poor | No | Commercial SiC wafer |

From the results of Examples 1 and 2 and Comparative Examples 1 and 2, it can be seen that if the thickness of an affected surface layer on a SiC single crystal wafer is at most 50 nm, the quality of an epitaxial film grown on the wafer is improved, and good ohmic contacts can be formed without carrying out any special pretreatment. From the results of Examples 3-5, it can be seen that the quality of an epitaxial film formed on a wafer is further improved if the thickness of an affected surface layer on the wafer is at most 30 nm.

When employing the solution growth method to prepare a SiC bulk single crystal from which wafers are to be cut, a SiC single crystal wafer according to the present invention can be manufactured by making the impurity oxygen concentration in the raw materials and the impurity oxygen concentration in the atmosphere during crystal growth each at most 100 ppm. The oxygen concentration in a SiC bulk single crystal is preferably further reduced by making the oxygen concentration in one or both of the raw materials and the atmosphere at most 100 ppb.

By using a SiC single crystal wafer according to the present invention, a degradation in the quality of an epitaxial film caused by a SiC single crystal wafer is suppressed, and a SiC semiconductor device of high reliability and high productivity can be manufactured. Furthermore, when forming ohmic contacts on the rear surface of a semiconductor wafer, special pretreatment of the surface becomes unnecessary, and the process of forming ohmic contacts can be simplified.

The invention claimed is:

1. A SiC single crystal bulk wafer comprising a SiC single crystal substrate having on an upper surface thereof an affected layer, which comprises a native oxide film or a subsurface damaged layer and which has a non-single crystal structure and which comprises at Si, C, and O (oxygen), the SiC single crystal substrate adapted for growing an epitaxial film thereon and characterized in that
   the affected layer has a thickness of at most 50 nm, and
   the SiC single crystal substrate has an oxygen content of at most $1.0 \times 10^{17}$ atoms/cm³.

2. The SiC single crystal bulk wafer as set forth in claim 1 wherein the thickness of the affected layer is at most 30 nm and the oxygen content of the SiC single crystal portion is at $5 \times 10^{16}$ atoms/cm³.

3. The SiC single crystal bulk wafer as set forth in claim 1 wherein the thickness of the affected layer is at most 10 nm.

4. The SiC single crystal bulk wafer as set forth in claim 1 having a diameter of at least 50.8 mm (2 inches).

5. The SiC single crystal bulk wafer as set forth in claim 1 wherein the SiC single crystal portion has a crystal type selected from 3C-SiC, 4H-SiC, and 6H-SiC.

6. A SiC single crystal epitaxial wafer comprising a substrate made from the SiC single crystal bulk wafer, the SiC single crystal bulk wafer characterized as being the SiC single crystal wafer as set forth in claim 1 from which the affected layer has been removed from the upper surface of the wafer on which an epitaxial film is to be grown and an epitaxial film which is grown on the upper surface of the wafer from which the affected layer was removed.

7. A semiconductor device manufactured using a SiC single crystal epitaxial wafer as set forth in claim 6.

8. A method of manufacturing a SiC bulk single crystal for use as material for a SiC single crystal wafer, the SiC single crystal wafer having on a surface thereof an affected layer which has a non-single crystal structure and which comprises at least Si, C, and O (oxygen), characterized in that the affected layer has a thickness of at most 50 nm, and the wafer has an oxygen content of at most $1.0 \times 10^{17}$ atoms/cm³ in a SiC single crystal portion thereof, the method comprising growing a SiC crystal on a seed crystal by the solution growth method using a SiC solution prepared by melting raw materials in the form of Si or Si and M (wherein M is at least one metal other than Si) and dissolving C in the resulting melt, characterized in that
   the raw materials before melting has an oxygen content of at most 100 ppm, and
   the atmosphere around the liquid phase during crystal growth has an oxygen concentration of at most 100 ppm.

9. A method as set forth in claim 8 wherein the oxygen content of the raw materials before melting is at most 1 ppm.

10. A method as set forth in claim 8 wherein the oxygen concentration in the atmosphere around the liquid phase during crystal growth is at most 1 ppm.

11. A method of manufacturing a SiC single crystal wafer for use as a substrate for growing a SiC single crystal epitaxial film, characterized by removing the affected layer from the SiC single crystal bulk wafer as set forth in claim 1 by in situ etching.

* * * * *